(12) United States Patent
Tamaoka et al.

(10) Patent No.: US 10,677,258 B2
(45) Date of Patent: Jun. 9, 2020

(54) BLOWER COMPRISING IMPELLER AND MOTOR

(71) Applicant: NIDEC CORPORATION, Kyoto (JP)

(72) Inventors: Takehito Tamaoka, Kyoto (JP); Masashi Hirayama, Kyoto (JP); Naruyuki Horaitani, Kyoto (JP); Shun Hirano, Kyoto (JP); Takayuki Ito, Kyoto (JP)

(73) Assignee: NIDEC CORPORATION, Kyoto-shi (JP)

( * ) Notice: Subject to any disclaimer, the term of this patent is extended or adjusted under 35 U.S.C. 154(b) by 192 days.

(21) Appl. No.: 15/875,134

(22) Filed: Jan. 19, 2018

(65) Prior Publication Data

US 2018/0202455 A1  Jul. 19, 2018

Related U.S. Application Data

(60) Provisional application No. 62/448,165, filed on Jan. 19, 2017.

(30) Foreign Application Priority Data

May 15, 2017 (JP) .................................. 2017-096617

(51) Int. Cl.
*F04D 29/28* (2006.01)
*F04D 25/08* (2006.01)
(Continued)

(52) U.S. Cl.
CPC ........... *F04D 29/282* (2013.01); *F04D 17/16* (2013.01); *F04D 25/0606* (2013.01);
(Continued)

(58) Field of Classification Search
CPC .... F04D 29/666; F04D 29/282; F04D 29/281; F04D 29/4226; F04D 17/16; F04D 25/08; G06F 1/203; H05K 7/20172; H01L 23/467
(Continued)

(56) References Cited

U.S. PATENT DOCUMENTS 2,443,411 A * 6/1948 Wolfe .................. F04D 29/281
416/213 R
2,653,755 A * 9/1953 Kruhmin ............... F04D 29/282
416/184
(Continued)

FOREIGN PATENT DOCUMENTS

| GB | 115957 A * | 5/1918 | ........... F04D 29/281 |
| GB | 1108932 A * | 4/1968 | ........... F04D 29/281 |
| JP | 2006-170090 A | 6/2006 | |

*Primary Examiner* — Moshe Wilensky
*Assistant Examiner* — Topaz L. Elliott
(74) *Attorney, Agent, or Firm* — Westerman, Hattori, Daniels & Adrian, LLP

(57) ABSTRACT

The blowing device includes an impeller that is rotatable about a center axis and a motor that drives the impeller. The impeller includes a plurality of vanes arranged in a circumferential direction, a flange in which the plurality of vanes are provided at the outer circumferential edge in a radial-direction outside, and a plate-shaped first shielding unit located between the vanes adjacent to each other in the circumferential direction. The first shielding unit is connected to a rear edge surface on an opposite side to the rotation direction of the vane and an outside surface located on the radial-direction outside of the flange.

21 Claims, 10 Drawing Sheets

(51) Int. Cl.
  *F04D 29/42* (2006.01)
  *F04D 29/30* (2006.01)
  *F04D 17/16* (2006.01)
  *F04D 29/66* (2006.01)
  *G06F 1/20* (2006.01)
  *H05K 7/20* (2006.01)
  *H01L 23/467* (2006.01)
  *F04D 25/06* (2006.01)

(52) U.S. Cl.
  CPC ............ *F04D 25/08* (2013.01); *F04D 29/30* (2013.01); *F04D 29/4226* (2013.01); *F04D 29/666* (2013.01); *G06F 1/203* (2013.01); *H01L 23/467* (2013.01); *H05K 7/20172* (2013.01); *F05B 2230/238* (2013.01); *F05B 2230/25* (2013.01); *F05B 2240/301* (2013.01); *F05B 2250/71* (2013.01); *F05B 2260/20* (2013.01); *F05B 2260/96* (2013.01); *F05B 2280/105* (2013.01); *F05B 2280/1071* (2013.01); *F05B 2280/5002* (2013.01)

(58) Field of Classification Search
  USPC ........................................................ 415/206
  See application file for complete search history.

(56) References Cited

U.S. PATENT DOCUMENTS

| | | | | |
|---|---|---|---|---|
| 3,466,095 | A  * | 9/1969 | Weihmuller | B65G 31/04 |
| | | | | 406/100 |
| 6,568,907 | B2 * | 5/2003 | Horng | F04D 29/282 |
| | | | | 416/185 |
| 6,881,035 | B1 * | 4/2005 | Paulsen | F01D 5/14 |
| | | | | 416/183 |
| 7,381,027 | B2 * | 6/2008 | Kaneko | F04D 29/282 |
| | | | | 415/102 |
| 7,670,115 | B2 * | 3/2010 | Cho | F04D 29/281 |
| | | | | 416/186 R |
| 8,182,214 | B2 * | 5/2012 | Dickertmann | F04D 29/2255 |
| | | | | 415/203 |
| 9,341,192 | B2 * | 5/2016 | Aiello | F04D 29/051 |
| 10,286,167 | B2 * | 5/2019 | Bothma | G01F 1/0755 |
| 2008/0130226 | A1 * | 6/2008 | Yamashita | F04D 29/281 |
| | | | | 361/695 |
| 2012/0219436 | A1 * | 8/2012 | Fujiwara | F04D 29/281 |
| | | | | 417/410.1 |
| 2012/0224951 | A1 * | 9/2012 | Degner | F04D 25/062 |
| | | | | 415/174.1 |
| 2012/0229982 | A1 * | 9/2012 | Hata | G06F 1/1658 |
| | | | | 361/697 |
| 2012/0247739 | A1 * | 10/2012 | Fujiwara | F04D 29/051 |
| | | | | 165/121 |
| 2014/0049906 | A1 * | 2/2014 | Aiello | F04D 29/051 |
| | | | | 361/679.49 |
| 2014/0216460 | A1 * | 8/2014 | Bothma | F04D 25/0606 |
| | | | | 128/204.18 |
| 2018/0363670 | A1 * | 12/2018 | Johansen | F04D 29/282 |

* cited by examiner

BLOWER COMPRISING IMPELLER AND MOTOR

FIELD OF THE INVENTION

The present invention relates to a blower.

DESCRIPTION OF THE RELATED ART

There has been known a blower that blows air to an outside in a radial direction by rotating a plurality of vanes about an axial direction using a motor. In the blower, for example, the air flowing between the vanes adjacent to each other in a circumferential direction from an inlet port located on an upper side in the axial direction is blown to the outside in the radial direction by the rotation of the vane. For example, the blower is used as a cooling fan for an electronic device in which thinning is required.

For example, Unexamined Japanese Patent Publication No. 2006-170090 discloses a blower including a plurality of vanes around a rotor of a motor as a prior art relating to the present invention. In the blower, a reinforcing unit is provided between the rotor and the vane in order to prevent a vibration of the rotor and a resonance noise.

SUMMARY OF THE INVENTION

However, the air flowing from the inlet port to the space between the vanes is delivered to the lower side in the axial direction by the rotation of the vane. Blowing efficiency of the blower is degraded with increasing air delivered to the lower side in the axial direction. In Unexamined Japanese Patent Publication No. 2006-170090, there is no description on this problem. For example, in the blower of Unexamined Japanese Patent Publication No. 2006-170090, the reinforcing unit is provided at the coupling unit between the cup-shaped rotor and the vane. An air volume of the blower does not increase by the reinforcing portion, but decreases according to an increase in volume ratio of the reinforcing unit to the vane. That is, the reinforcing unit does not contribute to improvement of the blowing efficiency.

An object of the present invention is to provide a blower capable of improving the blowing efficiency.

In order to achieve the object, a blower according to one aspect of the present invention includes an impeller that is rotatable about a central axis and a motor that drives the impeller. The impeller includes a plurality of vanes arranged in a circumferential direction, a flange in which the plurality of vanes are provided at an outer circumferential edge on a radial-direction outside, and a plate-shaped first shielding unit located between the vanes adjacent to each other in the circumferential direction, the first shielding unit is connected to a rear edge surface on an opposite side to the rotating direction of the vane and an outside surface located on the radial-direction outside of the flange.

In the exemplary blower of the present invention, the blowing efficiency can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
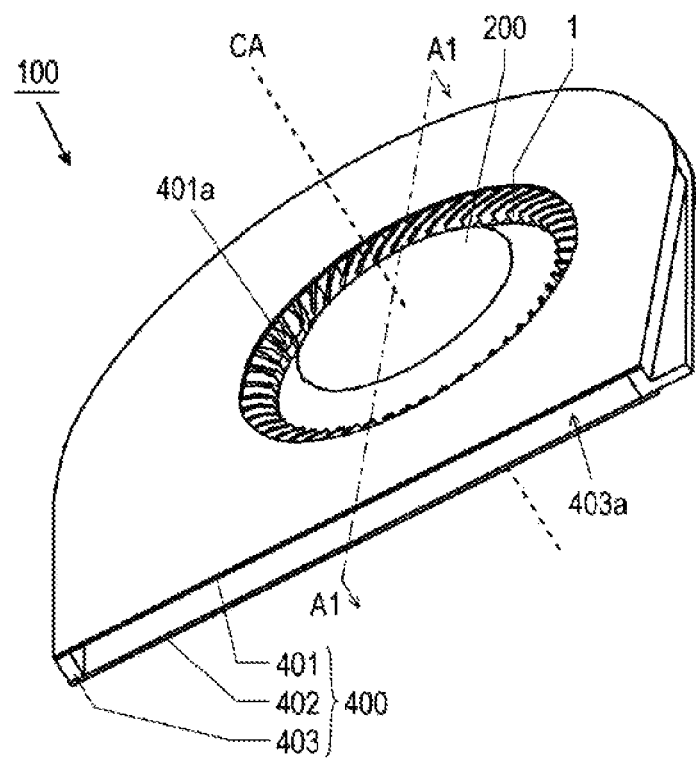
FIG. 1 is a perspective view illustrating an example of a blower.

Hereinafter, an exemplary embodiment of the present invention will be described with reference to the drawings.

In a blower 100 of the specification, a direction parallel to a central axis CA is called an "axial direction". In the axial direction, a direction from a support plate 402 (to be described later) toward an inlet plate 401 (to be described later) is called an "axial-direction upper side" as one side in the axial direction. In the axial direction, a direction from the inlet plate 401 toward the support plate 402 is called an "axial-direction lower side" as the other side in the axial direction.

In each component, an end on the axial-direction upper side is called an "upper end", and an end on the axial-direction lower side is called a "lower end". An end surface located on the axial-direction upper side is called an "upper end surface" as an one-side end surface located on one side in the axial direction, and an end surface located on the axial-direction lower side is called a "lower end surface" as the-other-side end surface located on the other side in the axial direction.

A direction orthogonal to the central axis CA is called a "radial direction". In the radial direction, a direction toward the central axis CA is called a "radial-direction inside", and a direction away from the central axis CA is called a "radial-direction outside". In each component, a side surface located on a radial-direction inside is called an "inside surface", and a side surface located on the radial-direction outside is called an "outside surface". An end on the radial-direction inside is called an "inner end", and an end on the radial-direction outside is called an "outer end". More specifically, when viewed in the axial direction, the "inner end" in the radial direction overlaps the "inside surface", and the "outer end" in the radial direction overlaps the "outside surface". A portion, which is located on the radial-direction inside with respect to the "outer end" in the radial direction and near the "outer end" in the radial direction, is called an "outer circumferential edge".

A circumferential direction centered around the central axis CA is called a "circumferential direction". One side in the circumferential direction is identical to a direction of an impeller 200 (to be described later) and a rotation direction Dro of a vane 1, and the other side in the circumferential direction is identical to an opposite side to the rotation direction Dro. In each component, a side surface located on the opposite side to the rotation direction Dro in the circumferential direction is called a "rear edge surface", and a side surface located on the side of the rotation direction Dro in the circumferential direction is called a "front edge surface".

Names of the direction, the surface, and the component do not express a positional relationship and the direction in the case that the blower 100 is incorporated in an actual device.

1. Embodiment

<1-1. Schematic Configuration of Blower>

Figure 2:
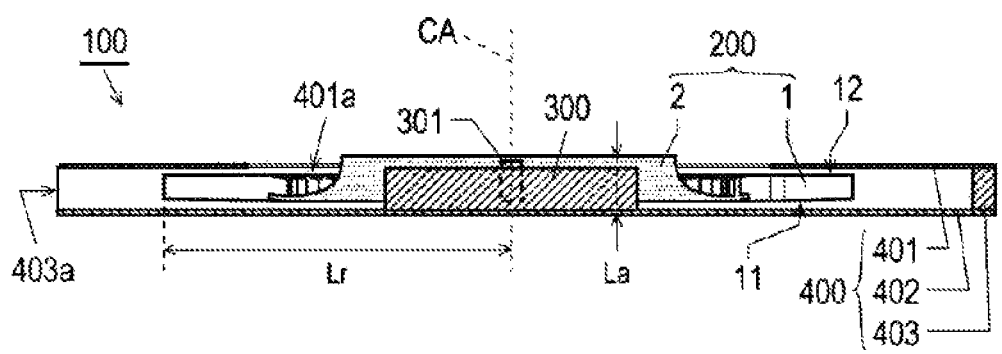
FIG. 2 is a sectional view illustrating a configuration example of the blower.

FIG. 1 is a perspective view illustrating an example of the blower 100. FIG. 2 is a sectional view illustrating a configuration example of the blower 100. FIG. 2 illustrates a section along an alternate long and short dash line A1-A1 of the blower 100, which is cut by a plane including the central axis CA in FIG. 1.

The blower 100 includes the impeller 200, a motor 300, and a housing 400.

The impeller 200 is one in which a plurality of vanes 1 are provided, and the impeller 200 is attached to the motor 300. The impeller 200 is rotatable about the central axis CA together with a shaft 301 of the motor 300. A shortest distance Lr in the radial direction from the central axis CA to the outer end (that is, a leading end) on the radial-direction outside of the vane 1 is larger than an axial direction length La of the blower 100, preferably at least five times the axial-direction length La. This enables production of the low-profile blower 100. A configuration of the impeller 200 will be described later.

The motor 300 rotates the shaft 301 about the central axis CA to drive the impeller 200.

The housing 400 accommodates the impeller 200 and the motor 300. The housing 400 includes the inlet plate 401, the support plate 402, and a sidewall 403.

The inlet plate 401 is provided on the axial-direction upper side with respect to the plurality of vanes 1, and faces a vane upper end surface 12 located on the axial-direction upper side of the vane 1 with a gap interposed therebetween. The inlet plate 401 includes an inlet port 401a piercing in the axial direction.

The support plate 402 is provided on the axial-direction lower side with respect to the plurality of vanes 1, faces a vane lower end surface 11 located on the axial-direction lower side of the vane 1 with a gap interposed therebetween, and supports the motor 300. More specifically, the motor 300 is fixed to a top surface of the support plate 402. The top surface of the support plate 402 faces a bottom surface of the inlet plate 401 in the axial direction.

The sidewall 403 is provided between the bottom surface of the inlet plate 401 and the top surface of the support plate 402, and forms an internal space in which the impeller 200 and the motor 300 are accommodated, together with the inlet plate 401 and the support plate 402. A blowing port 403a opened toward the radial direction is provided in the sidewall 403. The internal space of the housing 400 accommodates the impeller 200 and the motor 300, and is communicated with the outside of the housing 400 through the inlet port 401a and the blowing port 403a.

There is no particular limitation on materials of the inlet plate 401, the support plate 402, and the sidewall 403. For example, the inlet plate 401, the support plate 402, and the sidewall 403 are made of metal. By way of example, the inlet plate 401 and the support plate 402 are made of stainless steel, and the sidewall 403 is made of copper. The sidewall 403 is formed by forging, casting, or press working, and the inlet plate 401 and the support plate 402 are formed by insert molding or outsert molding. After the forming, the housing 400 is machined in order to guarantee shape accuracy.

Wind generated by the rotation of the impeller 200 directly hits the sidewall 403. Preferably, the sidewall 403 has high heat conductivity of, for example, at least 100 [W/m·K]. Consequently, even if air having a relatively high temperature flows into the blower 100, heat of the air blown onto the radial-direction outside by the rotation of the impeller 200 can effectively be radiated by the sidewall 403. This effect is particularly effective in the case that the blower 100 is used as a cooling fan.

<1-2. Configuration of Impeller>

Figure 3:
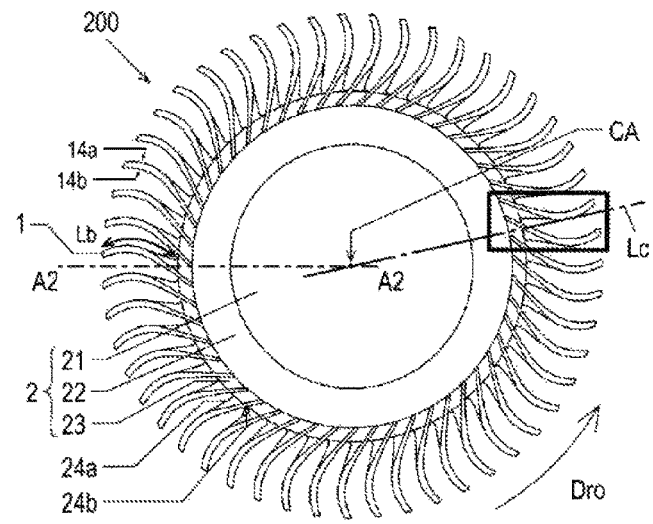
FIG. 3 is a top view illustrating an example of an impeller.
Figure 4:
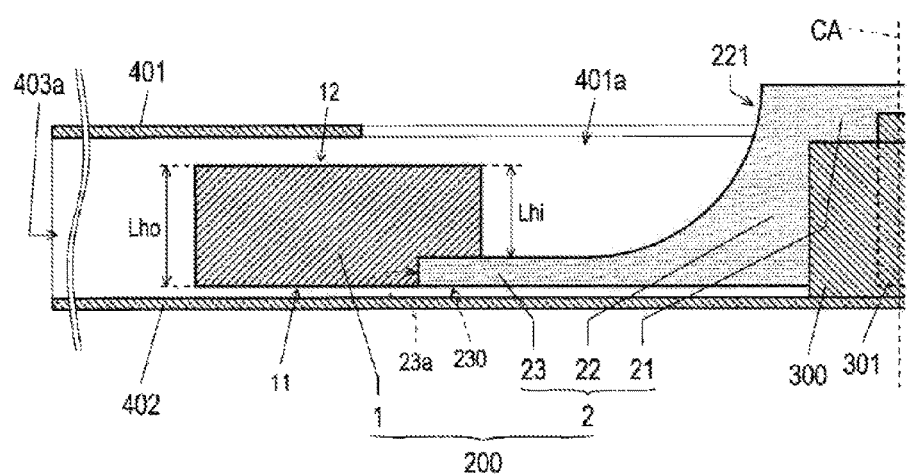
FIG. 4 is a sectional view illustrating an example of the blower when the blower is viewed in a circumferential direction.

A configuration of the impeller 200 will be described below. FIG. 3 is a top view illustrating an example of the impeller 200. FIG. 4 is a sectional view illustrating an example of the blower 100 when the blower 100 is viewed in the circumferential direction. FIG. 4 corresponds to the section of the blower 100 along the alternate long and short dash line A1-A1 in FIG. 1 and the section of the impeller 200 along an alternate long and short dash line A2-A2 in FIG. 3.

The impeller 200 includes the plurality of vanes 1, a cover 21, a cylindrical unit 22, a flange 23, a first shielding unit 24a, and a second shielding unit 24b. The cover 21, the cylindrical unit 22, and the flange 23 constitute a cup 2. That is, the impeller 200 includes the cup 2. The cup 2 accommodates the upper end of the motor 300 on the axial-direction upper side therein, namely, the cup 2 is attached to the upper end of the motor 300. The first shielding unit 24a and the second shielding unit 24b are provided such that the air scratched by the vane 1 is prevented from flowing to the axial-direction lower side, between the vanes 1 adjacent to each other in the circumferential direction and on the outside in the radial direction of the outer circumferential edge 230 of the flange 23. The configuration of the first shielding unit 24a and the second shielding unit 24b will be described later.

The plurality of vanes 1 are arrayed in the circumferential direction. Preferably, a number of vanes 1 is a prime number in order to prevent a noise, which is generated when the vane 1 scratches air. For example, preferably the number of vanes 1 is at least 31. Because a gap between the vanes 1 is narrowed according to the number of vanes 1, a static pressure between the vanes 1 increases, and the air between the vanes 1 is sent more vigorously onto the radial-direction outside. Thus, blowing efficiency of the blower 100 is improved. A configuration of the vane 1 will be described later.

The cover 21 is coupled to the shaft 301, and covers the top surface of the motor 300. The cylindrical unit 22 extends from the outer end on the radial-direction outside of the cover 21 toward at least the axial-direction lower side. The cover 21 and the cylindrical unit 22 constitute the internal space in which the upper end on the axial-direction upper side of the motor 300 is accommodated. The outside surface of the cylindrical unit 22 includes a curved surface 221. In sectional view from the circumferential direction, the curved surface 221 is oriented toward the axial-direction upper side and the radial-direction outside, and recessed on the opposite side to the direction in which the curved surface 221 is oriented. A center of curvature of the curved surface 221 is located on the side of the direction in which the curved surface 221 is oriented with respect to the curved surface 221. Thus, the air flows smoothly onto the radial-direction outside along the curved surface 221, and leads to the flange 23. The flange 23 extends from the outer end on the radial-direction outside of the cylindrical unit 22 toward the radial-direction outside. The plurality of vanes 1 are provided at an outer circumferential edge 230 on the radial-direction outside of the flange 23.

During the rotation of the impeller 200, the air flowing into the internal space of the housing 400 through the inlet port 401*a* flows onto the radial-direction outside along the curved surface 221 and the top surface of the flange 23, and flows between the plurality of vanes 1. The air becomes the wind by the plurality of vanes 1 rotating in the circumferential direction, flows onto the radial-direction outside of the impeller 200, and is sent to the outside of the housing 400 through the blowing port 403*a*.

Figure 5A:
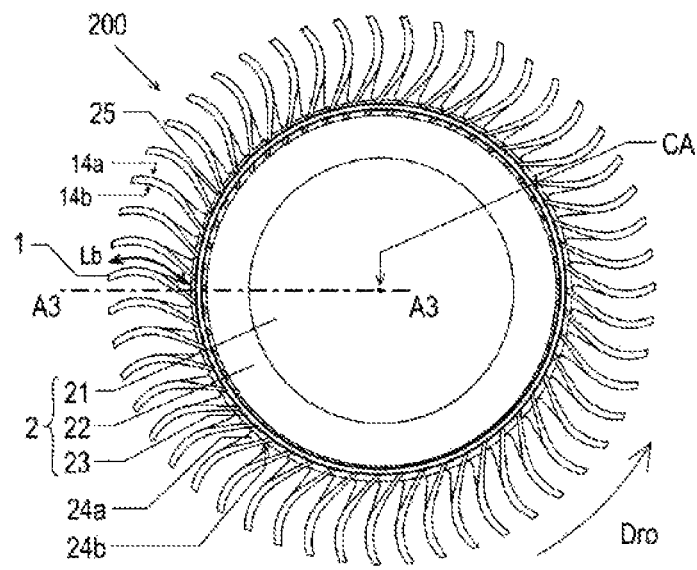
FIG. 5A is a top view illustrating another example of the impeller.
Figure 5B:
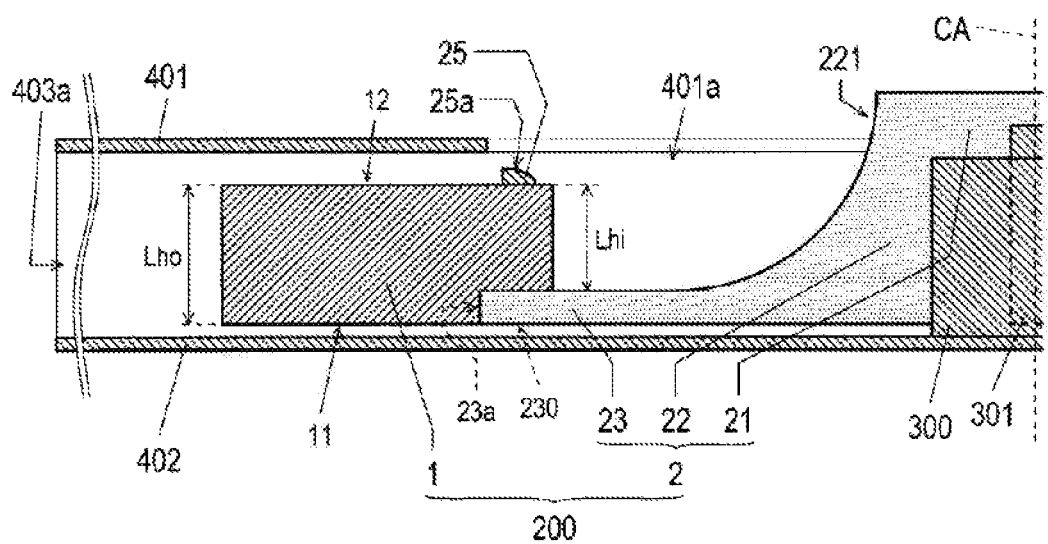
FIG. 5B is a sectional view illustrating another example of the blower when the blower is viewed in the circumferential direction.

The impeller 200 is not limited to the illustrations in FIGS. 3 and 4, but may further include an annular ring 25. FIG. 5A is a top view illustrating another example of the impeller 200. FIG. 5B is a sectional view illustrating another example of the blower 100 when the blower 100 is viewed in the circumferential direction. FIG. 5B corresponds to the section of the blower 100 along the alternate long and short dash line A1-A1 in FIG. 1 and the section of the impeller 200 along an alternate long and short dash line A3-A3 in FIG. 5A.

In FIGS. 5A and 5B, the annular ring 25 is coupled to the plurality of vanes 1 on the axial-direction upper side of the vane 1. However, the annular ring 25 is not limited to the illustrations in FIGS. 5A and 5B, but may be coupled to the plurality of vanes 1 on the axial-direction lower side of the vane 1. That is, the annular ring 25 may be provided on at least one of the axial-direction upper side and the axial-direction lower side of the vane 1, and coupled to the plurality of vanes 1 on the at least one side. The annular ring 25 is coupled to the plurality of vanes 1, which allows improvement of strength of each vane 1 provided in the impeller 200. The annular ring 25 provided on the axial-direction upper side with respect to the vane 1 can prevent counter flow of the air temporarily drawn from the inlet port 401*a* toward the inlet port 401*a*. For example, when the annular ring 25 is provided on the axial-direction lower side with respect to the vane 1 while another inlet port (not illustrated) is provided in the support plate 402, the annular ring 25 provided on the axial-direction lower side with respect to the vane 1 can prevent the counter flow of the air temporarily drawn from another inlet port toward another inlet port.

The annular ring 25 includes a curved surface 25*a*. In sectional view from the circumferential direction, the curved surface 25*a* has a curved shape projecting toward the axial-direction upper side and the radial-direction inside. Consequently, the air drawn through the inlet port 401*a* flows along the curved surface 25*a* of the annular ring 25. Drawing efficiency is improved because the air flow is hardly separated from the curved surface 25*a*.

<1-3. Configuration of Vane>

The configuration of the vane 1 will be described below with reference to FIGS. 3 and 4. As illustrated in FIGS. 3 and 4, each vane 1 extends from an outer circumferential edge 230 of the flange 23 toward at least the radial-direction outside. For this reason, the more vanes 1 can be arrayed in the circumferential direction compared with the case that the plurality of vanes 1 extend from an inner circumferential edge of the flange 23.

The inner end in the radial-direction inside of the vane 1 overlaps inlet port 401*a* when viewed from axial direction. Consequently, the vane 1 can scratch the air drawn from the inlet port 401*a*, and generate the wind. An area in which the vane 1 scratches the air is enlarged compared with the case that the inner end in the radial-direction inside of the vane 1 is located on the radial-direction outside with respect to the inlet port 401*a*, so that vane 1 can generate a more amount of wind. Thus, the drawing efficiency at the inlet port 401*a* can be improved, and airflow of the blower 100 can further be increased.

The inner end in the radial-direction inside of the vane 1 projects from the flange 23 toward the axial direction upper side at the outer circumferential edge 230 of the flange 23. The inner end of the vane 1 projects at the outer circumferential edge 230 when viewed from the axial direction, so that the number of vanes 1 provided in the circumferential direction can be increased compared with the case that the inner end is located in a central portion of the impeller 200. Thus, the airflow of the blower 100 is easily increased.

The inner end in the radial-direction inside of the vane 1 is not limited to the example in FIG. 4. Alternatively, the inner end on the radial-direction inside of the vane 1 may project toward the axial-direction lower side at the outer circumferential edge 230. Consequently, the area in which the vane 1 scratches the air is further enlarged, and the more amount of wind can be generated. In the case that another inlet port (not illustrated) is also provided in the support plate 402, since the air can efficiently be drawn from the inlet port of the support plate 402, the airflow of the blower 100 is easy to increase.

As illustrated in FIG. 3, each vane 1 is curved in the circumferential direction when viewed from the axial direction. More specifically, each vane 1 has a curved shape projecting toward the opposite direction to the rotation direction Dro in the circumferential direction. As illustrated in FIGS. 3 and 4, when viewed from the axial direction, a length Lb along the vane 1 from an outside surface 23*a* located on the radial-direction outside of the flange 23 to the outer end on the radial-direction outside of the vane 1 is longer than a length Lho in the axial direction of the vane 1 on the radial-direction outside with respect to the outside surface 23*a*. Consequently, the low profile of the vane 1 of the impeller 200 can further be achieved, and downsize the blower 100.

The axial length Lho in the axial direction of the vane 1 on the radial-direction outside with respect to the outside surface 23a is larger than a length Lhi in the axial direction of the vane 1 on the axial direction inside with respect to the outside surface 23a. The area in which the vane 1 scratches the air is further enlarged, so that the vane 1 can generate a more amount of wind. Thus, the airflow of the blower 100 can be increased.

Each vane 1 is made of resin. In the embodiment, all the vanes 1 become a part of the same member as the flange 23. However, the vanes 1 are not limited to the embodiment. Alternatively, a part or all of the vanes 1 may be made of resin, and be a member different from the flange 23. That is, a part of the vanes 1 may be made of resin, and be a part of the same member as the flange 23. Alternatively, all of the vanes 1 may be a member different from the flange 23. However, preferably at least one of the plurality of vanes 1 is made of resin, and is a part of the same member as the flange 23. Consequently, the number of production steps can be decreased compared with the case that all of the vanes 1 are the member different from the flange 23, so that time (for example, a yield cycle time) necessary for the production can be shortened to improve production efficiency.

As illustrated in FIG. 4, each vane 1 includes the vane lower end surface 11 facing the support plate 402 and the vane upper end surface 12 facing the inlet plate 401. Each vane 1 also includes a rear edge surface 14a located on the opposite side to the rotation direction Dro of the impeller 200 in the circumferential direction and a front edge surface 14b located on the side of the rotation, direction Dro of the impeller 200 in the circumferential direction. Because the front edge surface 14b of the vane 1 presses the air during the rotation of the impeller 200, a positive pressure is applied to the front edge surface 14b while a negative pressure is applied to the rear edge surface 14a. When viewed from the axial direction, the rear edge surface 14a and the front edge surface 14b of each vane 1 are curved toward the opposite side to the rotation direction Dro in the circumferential direction.

<1-3-1. Configuration of Rear Edge Surface>

Figure 6A:
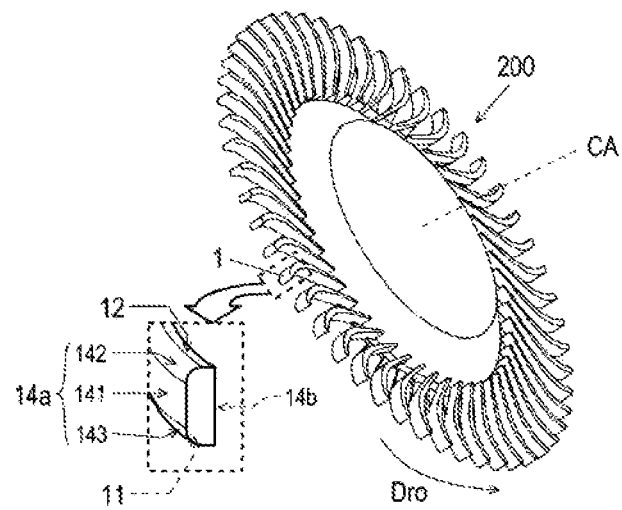
FIG. 6A is a view illustrating a configuration of a rear edge surface of a vane on an opposite side to a rotation direction.
Figure 6B:
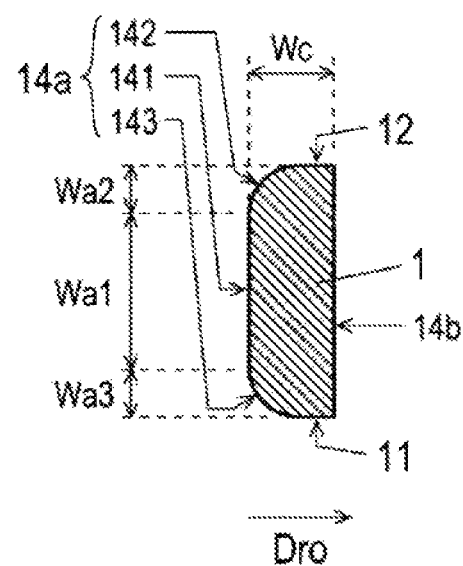
FIG. 6B is a sectional view of the vane when the vane is viewed from a direction in which the vane extends.

A configuration of the rear edge surface 14a of the vane 1 will be described below. FIG. 6A is a view illustrating a configuration of the rear edge surface 14a of the vane 1 on an opposite side to the rotation direction Dro. FIG. 6B is a sectional view of the vane 1 when the vane 1 is viewed from a direction in which the vane 1 extends.

As illustrated in FIGS. 6A and 6B, the rear edge surface 14a includes a rear surface 141, a first curved surface 142, and a second curved surface 143. In planar view from the axial direction, the rear surface 141, the first curved surface 142, and the second curved surface 143 have the curved shape projecting toward the opposite side to the rotation direction Dro in the circumferential direction.

In sectional view from the extending direction of the vane 1, the rear surface 141 extends straight, and is parallel to the axial direction.

In sectional view from the extending direction of the vane 1, the first curved surface 142 has the curved shape projecting the opposite side to the rotation direction Dro in the circumferential direction and the axial-direction upper side, and is connected to the upper end surface 12 of the vane 1 and the upper end on the axial-direction upper side of the rear surface 141. More specifically, in sectional view from the extending direction of the vane 1, the first curved surface 142 has the curved shape projecting toward the axial-direction upper side and the opposite side to the rotation direction Dro in the circumferential direction. The upper end on the axial-direction upper side of the first curved surface 142 is coupled to the end on the opposite side to the rotation direction Dro in the circumferential direction of the vane upper end surface 12. The lower end on the axial-direction lower side of the first curved surface 142 is coupled to the upper end on the axial-direction upper side of the rear surface 141.

Preferably, the first curved surface 142 is smoothly connected to the vane upper end surface 12 and the rear surface 141. More specifically, in sectional view front the extending direction of the vane 1, preferably a tangential direction of the first curved surface 142 at the upper end in the axial direction is parallel to a tangential direction of the vane upper end surface 12 at the end on the opposite side to the rotation direction Dro in the circumferential direction. In sectional view from the extending direction of the vane 1, preferably the tangential direction of the first curved surface 142 at the lower end in the axial direction is parallel to the rear surface 141. Consequently, the rapid change can be prevented in the flowing direction of the air flowing from the vane upper end surface 12 to the first curved surface 142. The rapid change can also be prevented in the flowing direction of the air flowing from the first curved surface 142 to the rear surface 141. This enables the contribution to the prevention of the noise generated by providing the first curved surface 142 in the rear edge surface 14a.

In sectional view from the extending direction of the vane 1, the second curved surface 143 has the curved shape projecting toward the opposite side to the rotation direction Dro in the circumferential direction and the axial-direction lower side, and is connected to the lower end surface 11 of the vane 1 and the lower end on the axial-direction lower side of the rear surface 141. More specifically, in sectional view from the extending direction of the vane 1, the second curved surface 143 has the curved shape projecting toward the axial-direction lower side and the opposite side to the rotation direction Dro in the circumferential direction. The lower end on the axial-direction lower side of the second curved surface 143 is coupled to the end on the opposite side to the rotation direction Dro in the circumferential direction of the vane lower end surface 11. The upper end on the axial-direction upper side of the second curved surface 143 is coupled to the lower end on the axial-direction lower side of the rear surface 141.

Preferably, the second curved surface 143 is smoothly coupled to the vane lower end surface 11 and the rear surface 141. More specifically, in sectional view from the extending direction of the vane 1, preferably the tangential direction of the second curved surface 143 at the upper end in the axial direction is parallel to the rear surface 141. In sectional view from the extending direction of the vane 1, preferably the tangential direction of the second curved surface 143 at the lower end in the axial direction is parallel to the tangential direction of the vane lower end surface 11 at the end on the opposite side to the rotation direction Dro in the circumferential direction. Consequently, the rapid change can be prevented in the flowing direction of the air flowing from the vane lower end surface 11 to the second curved surface 143. The rapid change can also be prevented in the flowing direction of the air flowing from the second curved surface 143 to the rear surface 141. This enables the contribution to the prevention of the noise generated by providing the second curved surface 143 in the rear edge surface 14a.

In FIG. 6B, in sectional view from the extending direction of the vane 1, for example, a width (Wa1+Wa2+Wa3) is 1.4 [mm] in the axial direction of the vane 1. For example, a width Wa1 is 0.8 [mm] in the axial direction of the rear surface 141. For example, a width Wa2 is 0.3 [mm] in the axial direction of the first curved surface 142, and a width Wa3 is 0.3 [ram] in the axial direction of the second curved surface 143.

In sectional view from the extending direction of the vane 1, for example, a thickness of the vane 1 in the extending direction of the vane 1 and the direction perpendicular to the axial direction is kept constant at a range of 0.25 to 0.8 [mm]. In the embodiment, the vane 1 has a thickness Wc of 0.5 [mm]. By setting the thickness of the vane 1 to a proper size, the strength of the vane 1 can be secured, and bending or breakage of the vane 1 can be prevented.

Figure 7A:
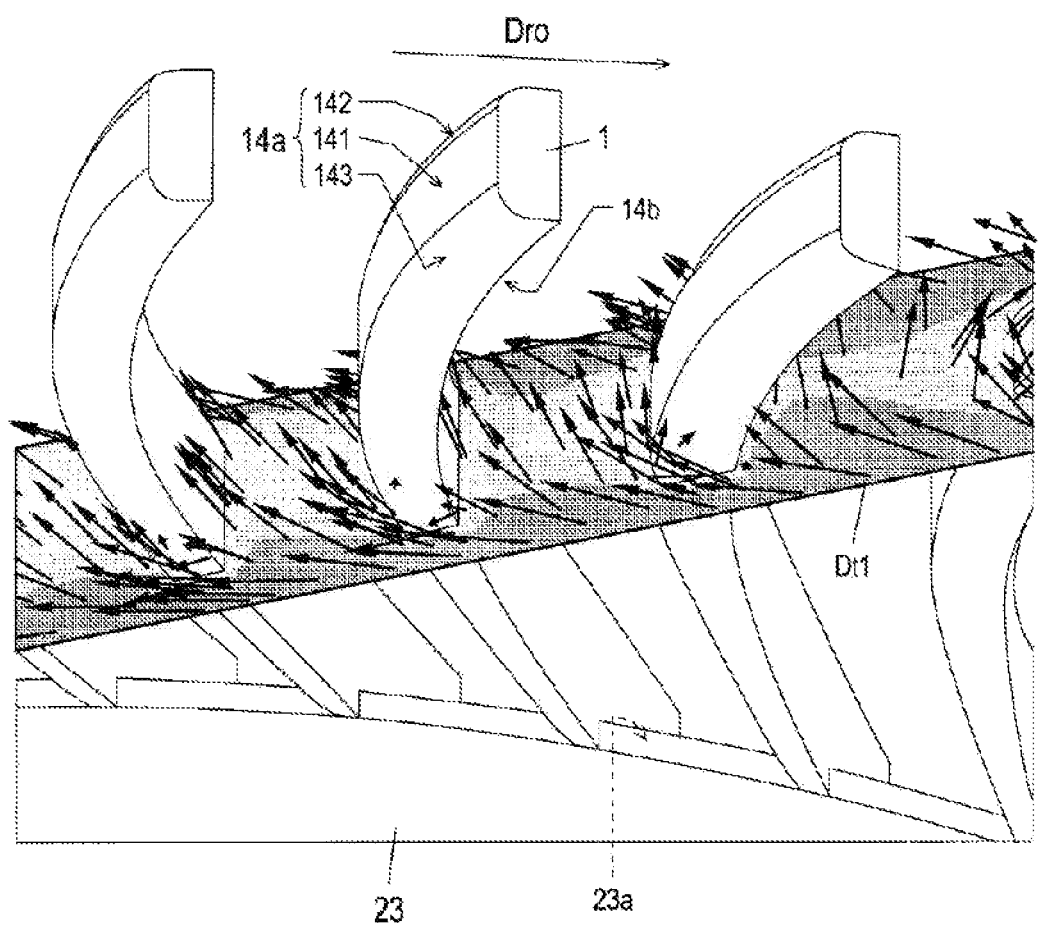
FIG. 7A is a view illustrating a distribution of a noise generated near the vane in which a first curved surface and a second curved surface are provided in the rear edge surface.
Figure 7B:
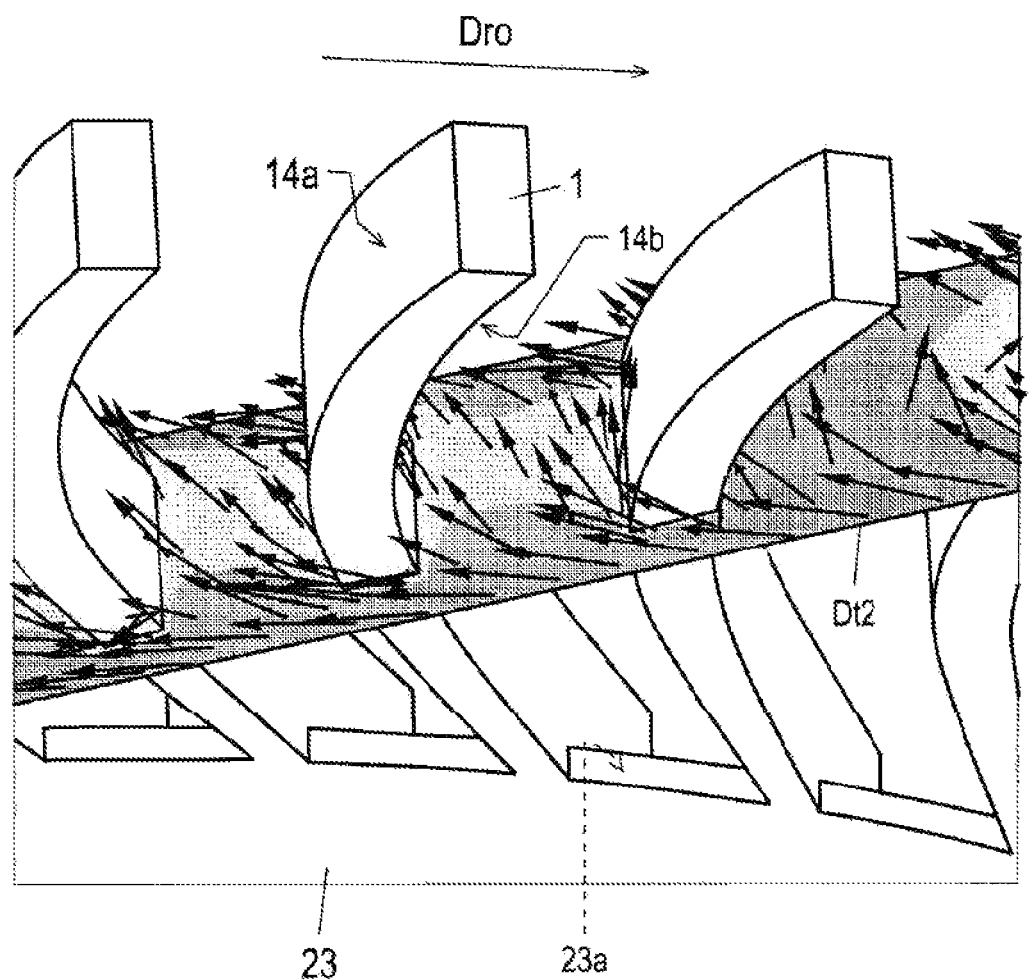
FIG. 7B is a view illustrating a distribution of the noise generated near the vane in which the first curved surface and the second curved surface are not provided in the rear edge surface.

The first curved surface 142 and the second curved surface 143 are provided in the rear edge surface 14a in order to prevent the noise generated by a wind noise of the vane 1 during the rotation of the impeller 200. FIGS. 7A and 7B illustrate results in which a distribution of the noise generated near the vane 1 is analyzed by computer simulation. FIG. 7A is a view illustrating a distribution Dt1 of the noise generated near the vane 1 in which the first curved surface 142 and the second curved surface 143 are provided in the rear edge surface 14a. FIG. 7B is a view illustrating a distribution Dt2 of the noise generated near the vane 1 in which the first curved surface 142 and the second curved surface 143 are not provided in the rear edge surface 14a. In the noise distribution Dt1 of FIG. 7A and the noise distribution Dt2 of FIG. 7B, the depth of color of a region expresses noise intensity. That is, a larger noise is generated with the denser color of the region. In FIGS. 7A and 7B, arrows express the flowing direction of the air.

A deep-color region of the noise distribution Dt1 in FIG. 7A is smaller than that of the noise distribution Dt2 in FIG. 7B. In a vicinity of the rear edge surface 14a, the color of the region near the rear edge surface 14a in the noise distribution Dt1 is deeper than the color of the region near the rear edge surface 14a in the noise distribution Dt2. Consequently, it is found that the noise, which is generated in the case that the first curved surface 142 and the second curved surface 143 are provided in the rear edge surface 14a of the vane 1 during the rotation of the impeller 200, is effectively prevented compared with the case that the first curved surface 142 and the second curved surface 143 are not provided in the rear edge surface 14a of the vane 1.

In the embodiment, the rear edge surface 14a includes both the first curved surface 142 and the second curved surface 143. The present invention is not limited to the embodiment. Alternatively, the rear edge surface 14a may include one of the first curved surface 142 and the second curved surface 143. In other words, the vane 1 may include only the first curved surface 142 or only the second curved surface 143 in the rear edge surface 14a. In sectional view from the extending direction of the vane 1, the rear edge surface 14a of the vane 1 may include a rear surface 141 parallel to the axial direction and at least one of the first curved surface 142 and the second curved surface 143. Consequently, when the blower 100 is driven to rotate the impeller 200, turbulence is hardly generated near the rear edge surface 14a of the vane 1, which is on the opposite side to the rotation direction Dro of the impeller 200 in the circumferential direction. Thus, the generation of the noise due to the rotation of the impeller 200 can be prevented. A configuration in which the vane 1 includes neither the first curved surface 142 nor the second curved surface 143 in the rear edge surface 14a can be adopted in the case that the necessity of the prevention of the noise generated during the rotation of the impeller 200 is eliminated.

In the noise distribution Dt1 of FIG. 7A, the color of the region near the first curved surface 142 is paler than the color of the region near the second curved surface 143. That is, an effect that the first curved surface 142 prevents the noise is stronger than an effect that the second curved surface 143 prevents the noise. Preferably, the first curved surface 142 is provided in the rear edge surface 14a in the case that one of the first curved surface 142 and the second curved surface 143 is provided in the rear edge surface 14a. From the viewpoint of the prevention of the noise generated during the rotation of the impeller 200, preferably both the first curved surface 142 and the second curved surface 143 are provided in the rear edge surface 14a. A degree of the noise prevention effect is, in descending order, the configuration in which both the first curved surface 142 and the second curved surface 143 are provided in the rear edge surface 14a, the configuration in which the first curved surface 142 is provided in the rear edge surface 14a, the configuration in which the second curved surface 143 is provided in the rear edge surface 14a, and the configuration in which neither the first curved surface 142 nor the second curved surface 143 is provided in the rear edge surface 14a.

<1-3-2. Configuration of First Shielding Unit and Second Shielding Unit>

Figure 8A:
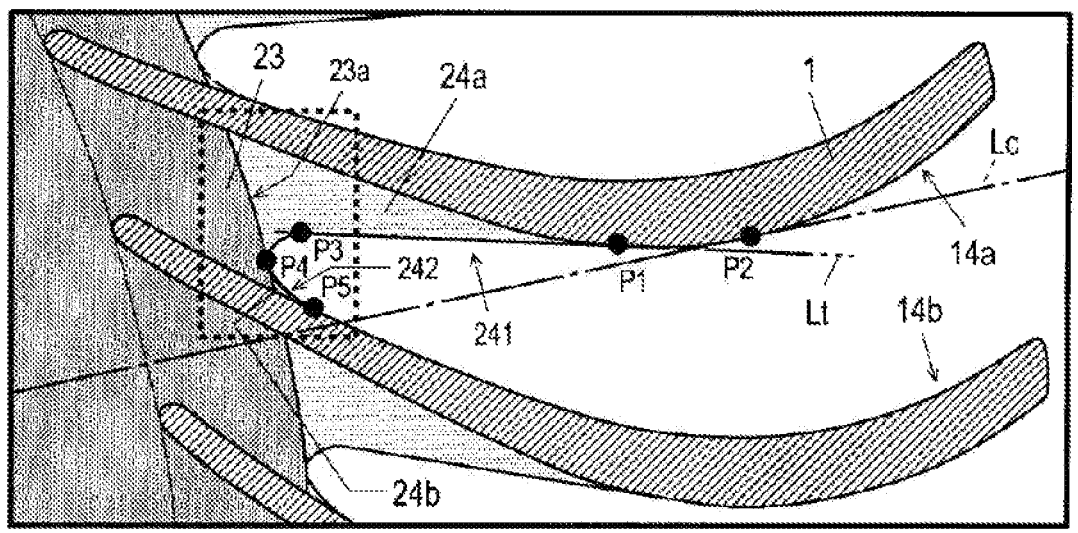
FIG. 8A is a view illustrating a configuration example of a first shielding unit and a second shielding unit between the vanes adjacent to each other in the circumferential direction.
Figure 8B:
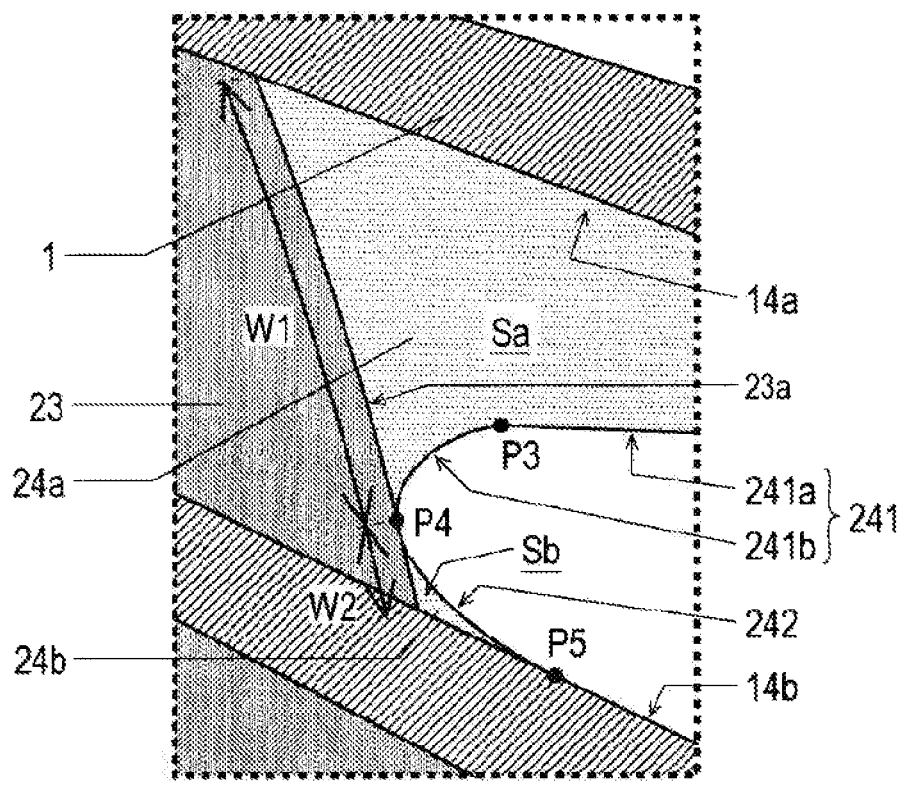
FIG. 8B is a locally enlarged view of the first shielding unit and the second shielding unit.

The configuration of the first shielding unit 24a and the second shielding unit 24b will be described below. FIGS. 8A and 8B are views illustrating the configuration of the first shielding unit 24a and the second shielding unit 24b. FIG. 8A is a view illustrating a configuration example of the first shielding unit 24a and the second shielding unit 24b between the vanes 1 adjacent to each other in the circumferential direction. FIG. 8B is a locally enlarged view of the first shielding unit 24a and the second shielding unit 24b. FIG. 8A corresponds to a portion surrounded by a solid line in FIG. 3. FIG. 8B corresponds to a portion surrounded by a broken line in FIG. 8A.

<1-3-2-1. Configuration of First Shielding Unit>

The configuration of the first shielding unit 24a will be described with reference to FIGS. 8A and 8B. The first shielding unit 24a has a plate shape, and is located between the vane portions 1 adjacent to each other in the circumferential direction. The first shielding unit 24a is connected to the rear edge surface 14a on the opposite side to the rotation direction Dro of the vane 1 and the outside surface 23a located on the outside in the radial direction of the flange 23. When the vane 1 of the impeller 200 rotates, the air on the rear edge surface 14a of the vane 1 hardly flows to the axial-direction lower side by the first shielding unit 24a. Thus, more amount of air on the rear edge surface 14a can be scratched by the vane 1 and flow to the radial-direction outside. That is, an effective area where the wind flowing to the radial-direction outside is generated can be increased on the rear edge surface 14a. This enables the improvement of the blowing efficiency of the blower 100.

When viewed from the axial direction, a first end P1 in the radial-direction outside of the first shielding unit 24a is located on the radial-direction inside with respect to a second end P2 located on the opposite side to the rotation direction Dro in the circumferential direction between the inner end and the outer end in the radial direction of the vane 1. The first end P1 is an outer end located on the radial-direction outside of the first shielding unit 24a when viewed from the axial direction. When viewed from the axial direction, the first end portion P1 is located on the side of the rotation direction Dro in the circumferential direction with respect to the second end P2 in the rear edge surface 14a on the opposite side to the rotation direction Dro in the circumferential direction of the vane 1. The second end P2 is located at a position where a tangent Lc (an alternate long and short dash line Lc in FIG. 8A) of one rear edge surface 14a passing through the central axis CA is in contact with the rear edge surface 14a when viewed from the axial direction.

When viewed from the axial direction, an edge 241 on the opposite side to the rotation direction Dro in the circumferential direction of the first shielding unit 24a extends from the first end P1 toward the outer circumferential edge 230 of the flange 23. When viewed from the axial direction, the edge 241 includes a linear unit 241a and a first curved unit 241b.

The linear unit 241a extends straight toward the outer circumferential edge 230 of the flange 23. The direction in which the linear unit 241a extends is parallel to the direction in which a tangent Lt (an alternate long and two short dashes line Lt in FIG. 8A) of the rear edge surface 14a at the first end P1 extends. However, the linear unit 241a is not limited to this example. For example, the direction in which the linear unit 241a extends may not be parallel to the direction in which the tangent Lt of the rear edge surface 14a at the first end P1 extends.

The first curved unit 241b extends from a third end P3 toward a fourth end P4 on the radial-direction inside of the linear unit 241a. The third end portion P3 is an inner end located on the innermost radial-direction inside of the linear unit 241a when viewed from the axial direction. The fourth end P4 is an end of the edge 241 on the opposite side to the rotation direction Dro in the circumferential direction of the first shielding unit 24a, and is located in the outside surface 23a located on the radial-direction outside of the flange 23 when viewed from the axial direction. For example, the fourth end P4 is a contact point between the first curved unit 241 and the outside surface 23a of the flange 23 when viewed from the axial direction. That is, when viewed from the axial direction, the tangential direction at the fourth end P4 of the first curved unit 241b is identical to the tangential direction at the fourth end P4 of the outside surface 23a.

In these configurations, the first shielding unit 24a having a proper size can be provided between the vanes 1 adjacent to each other in the circumferential direction when viewed from the axial direction. Thus, when the impeller 200 rotates, the first shielding unit 24a can efficiently disturb the air flowing to the axial-direction lower side on the rear edge surface 14a of the vane 1.

When viewed from the axial direction, between the two vanes 1 adjacent to each other in the circumferential direction, a distance W1 along the outside surface 23a of the flange 23 between one of the vanes 1 located on the side of the rotation direction Dro in the circumferential direction and the fourth end P4 is longer than a distance W2 along the outside surface 23a of the flange 23 between the other vane 1 located on the opposite side to the rotation direction Dro in the circumferential direction and the fourth end portion P4. Consequently, the first shielding unit 24a provided between the vanes 1 adjacent to each other in the circumferential direction when viewed from the axial direction can be widened. Thus, when the impeller 200 rotates, the first shielding unit 24a can further efficiently disturb the air flowing to the axial-direction lower side on the rear edge surface 14a of the vane 1.

<1-3-2-2. Configuration of Second Shielding Unit>

The configuration of the second shielding unit 24b will be described below with reference to FIGS. 8A and 8B. The second shielding unit 24b has a plate shape, and is provided between the outside surface 23a located on the radial-direction outside of the flange portion 23 and the front edge surface 14b located on the side of the rotation direction Dro in the circumferential direction of the vane 1 between the two vanes 1 adjacent to each other in the circumferential direction.

The second shielding unit 24b includes a second curved unit 242. The second curved unit 242 is an edge in the rotation direction Dro of the second shielding unit 24b, and extends from the outer circumferential edge 230 of the flange 23 toward a fifth end P5 on the front edge surface 14b. The fifth end P5 is an outer end on the radial-direction outside of the second shielding unit 24b. More specifically, the fifth end P5 is an outer end located on the outermost radial-direction outside of the second curved unit 242 when viewed from the axial direction. Consequently, the second shielding unit 24b can be provided between the vanes 1 adjacent to each other in the circumferential direction when viewed from the axial direction. Thus, when the impeller 200 rotates, the second shielding unit 24b can disturb the air flowing to the axial-direction lower side on the front edge surface 14b of the vane 1. When the impeller 200 is molded, the front edge surface 14b close to the second shielding unit 24b can be molded with high accuracy.

Between the two vanes 1 adjacent to each other in the circumferential direction, a first area Sa viewed from the axial direction of the first shielding unit 24a is larger than a second area Sb viewed from the axial direction of the second shielding unit 24b. For example, the first area Sa is at least triple the second area Sb. Consequently, even if the size of the first shielding unit 24a of the impeller 200 molded using a metal mold varies, the variation can be minimised.

<1-4. Modifications of Embodiment>

In the embodiment, in sectional view from the circumferential direction, the vane upper end surface 12 of the vane 1 and the portion, facing the vane upper end surface 12, of the inlet plate 401 extend straight in the radial direction (see FIG. 4). However, the present invention is not limited to the embodiment.

<1-4-1. First Modification of Embodiment>

Figure 9A:
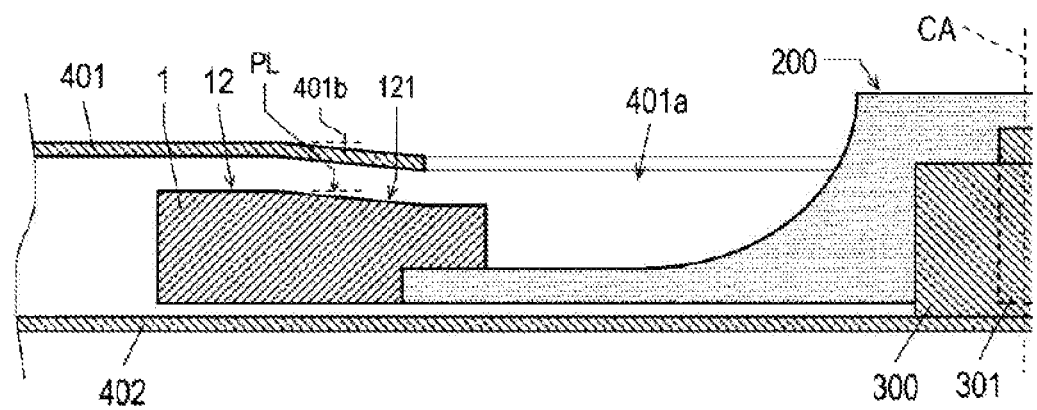
FIG. 9A is a sectional view illustrating a first modification of the configuration of the blower.

FIG. 9A is a sectional view illustrating a first modification of the configuration of the blower 100. As illustrated in FIG. 9A, the vane 1 further includes a first vane end surface 121. More specifically, the vane upper end surface 12 includes the first vane end surface 121. The first vane end surface 121 is located on the radial-direction outside with respect to the inlet port 401a. When viewed from the circumferential direction, the first vane end surface 121 is inclined onto the axial-direction upper side with respect to the plane PL orthogonal to the central axis CA toward the radial-direction outside. The inlet plate 401 further includes a first plate 401b. The first plate 401b is provided in parallel to the first vane end surface 121 on the axial-direction upper side with respect to the first vane end surface 121 of each of the plurality of vanes 1. Consequently, a gap between the vane 1 and the inlet plate 401 is relatively narrowed near the inlet port 401a, so that the counter flow of the air can be prevented in the gap.

Figure 9B:
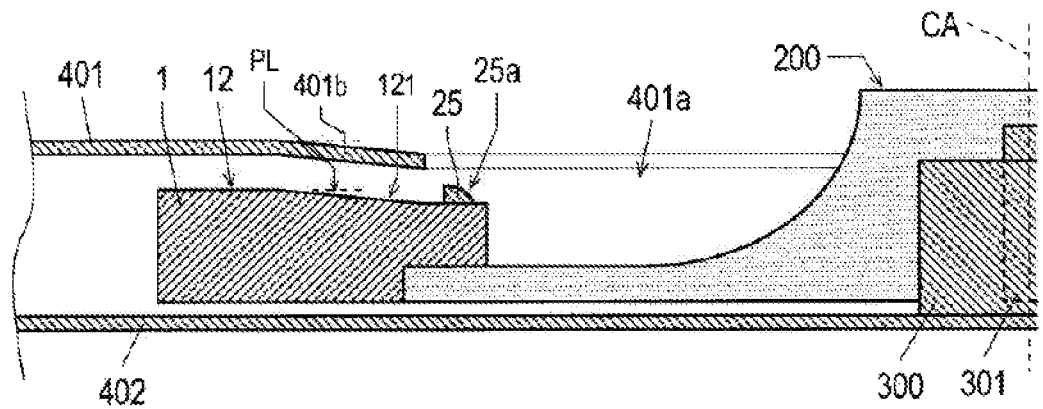
FIG. 9B is a sectional view illustrating another configuration of the first modification.

In the case that the impeller 200 includes the annular ring 25, the first vane end surface 121 may be located on the radial-direction outside with respect to the annular ring 25 as illustrated in FIG. 9B. Consequently, a gap between the annular ring 25 and the first plate 401b is relatively narrowed, so that the counter flow of the air can be prevented in the gap.

<1-4-2. Second Modification of Embodiment>

Figure 10A:
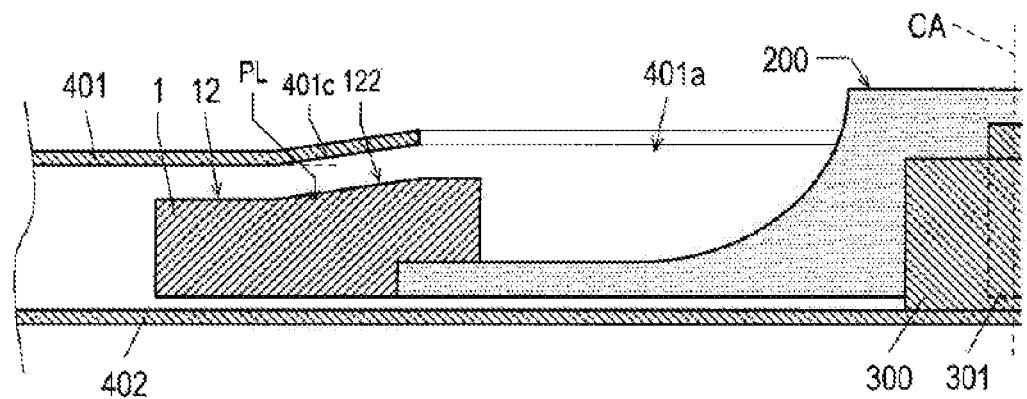
FIG. 10A is a sectional view illustrating a second modification of the configuration of the blower.
Figure 10B:
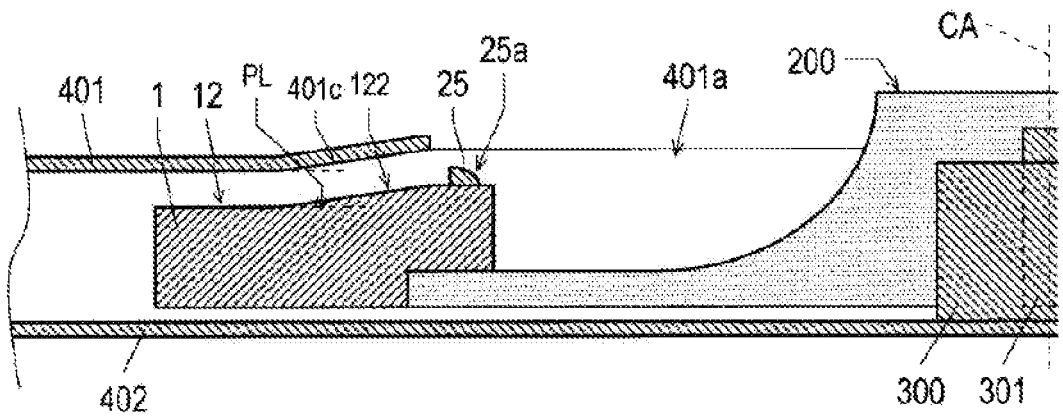
FIG. 10B is a sectional view illustrating another configuration of the second modification.

FIG. 10A is a sectional view illustrating a second modification of the configuration of the blower 100. As illustrated in FIG. 10A, the vane 1 further includes a second vane end surface 122. More specifically, the vane upper end surface 12 includes the second vane end surface 122. The second vane end surface 122 is located on the radial-direction outside with respect to the inlet port 401a. When viewed from the circumferential direction, the second vane end surface 122 is inclined onto the axial-direction lower side with respect to the plane PL orthogonal to the central axis CA toward the radial-direction outside. The inlet plate 401 further includes a second plate 401c. The second plate 401c is provided in parallel to the second vane end surface 122 on the upper side in axial direction with respect to the second vane end surface 122 of each of the plurality of vanes 1. In the case that the impeller 200 includes the annular ring 25, the second vane end surface 122 may be located on the radial-direction outside with respect to the annular ring 25 as illustrated in FIG. 10B. Consequently, because the air can efficiently be drawn from the inlet port 401a, the airflow of the blower 100 is easy to increase.

The first and second modifications are not limited to the illustrations in FIGS. 9A to 10B, but may appropriately be combined. For example, the inlet plate 401 may include the second plate 401c and the first plate 401b extending from the inner end on the radial-direction inside of the second plate 401c toward the radial-direction inside, and the vane upper end surface 12 may include the second vane end surface 122 and the first vane end surface 121 extending from the inner end on the radial-direction inside of the second vane end surface 122 toward the radial-direction inside. Consequently, the counter flow of the air can be prevented in the gap between the vane 1 and the inlet plate 401, and the counter flow of the air to the inlet port 401a can also be prevented.

<1-5. Application Example of Blower>

Figure 11A:
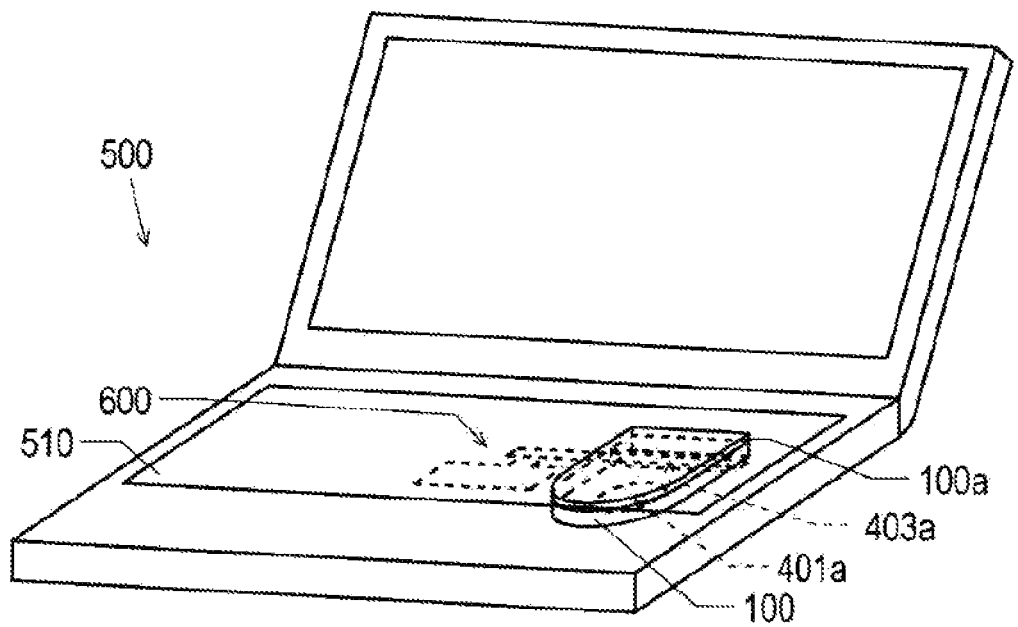
FIG. 11A is a perspective view illustrating an example of a laptop type information device on which the blower is mounted.
Figure 11B:
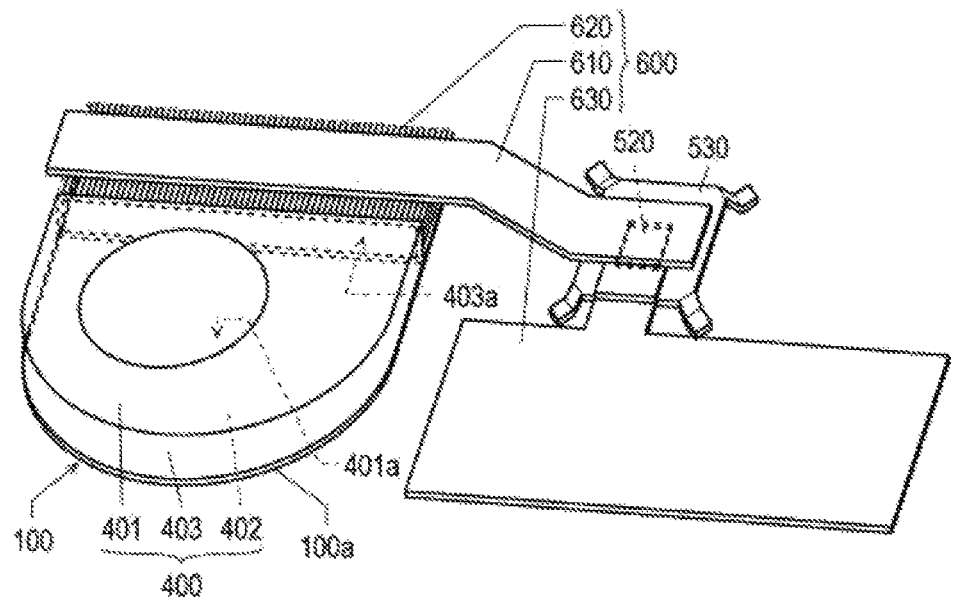
FIG. 11B is a perspective view illustrating a configuration example of the blower to which a heat pipe is attached.

An application example of the blower 100 will be described below. FIG. 11A is a perspective view illustrating an example of a laptop type information device 500 on which the blower 100 is mounted. FIG. 11B is a perspective view illustrating a configuration example of the blower 100 to which a heat pipe 600 is attached. The axial direction in FIG. 11A is reverse to that in FIGS. 1 to 10B. More specifically, the direction toward the upper side in FIG. 11A corresponds to the axial-direction lower side in FIGS. 1 to 10B, the direction toward the lower side in FIG. 11A corresponds to the axial-direction upper side in FIGS. 1 to 10B. The axial direction in FIG. 11B is identical to that in FIGS. 1 to 10B.

For example, the information device 500 is a low-profile personal computer such as a notebook personal computer. The blower 100 is used as a cooling fan for the information device 500, and mounted on the information device 500 together with a sheet-shape damper 100a and the heat pipe 600. For example, the blower 100 and the heat pipe 600 are attached to a rear surface of a keyboard 510 of the information device 500.

The damper 100a is a cushioning member that protects the blower 100 from a shock. The damper 100a is provided in the bottom surface in the axial direction of the blower 100. The blower 100 is attached to the rear surface of the keyboard 510 with the damper 100a interposed therebetween.

The heat pipe 600 is a member that conducts heat generated from the inside and a heat generation portion of the information device 500. In FIG. 11B, the heat pipe 600 conducts the heat generated from the blower 100 and a CPU 520 mounted on the information device 500. The heat pipe 600 includes a heat transfer sheet 610, a heat sink 620, and a heat spreader 630.

The heat transfer sheet 610 is a belt-shape heat conduction member, and conducts the heat of the CPU 520 disposed on a base 530 to the heat sink 620. One end of the heat transfer sheet 610 adheres to the heat sink 620 in a heat conductive manner, and the other end of the heat transfer sheet 610 adheres to the CPU 520 in a heat conductive manner with the heat spreader 630 interposed therebetween.

The heat sink 620 is provided in the blowing port 403a of the blower 100 so as to blow air, and radiates the heat conducted from the heat transfer sheet 610 to the air blown from blowing port 403a.

The heat spreader 630 is a sheet-shape heat conduction member. A part of the heat spreader 630 adheres to the CPU 520 in a heat conductive manner. Another part of the heat spreader 630 adheres to, for example, the rear surface of the keyboard 510 in a heat conductive manner. The heat spreader 630 conducts the heat of the CPU 520 to a casing (not illustrated) of the information device 500 and the air blown by the blower 100.

At least one of the inlet plate 401, the support plate 402, and the sidewall 403 of the blower 100 may be connected to the heat pipe 600 in a heat conductive manner by soldering or a heat conductive both-sided or single-sided adhesive tape. At least one of the inlet plate 401, the support plate 402, and the sidewall 403 of the blower 100 may be connected to one end of the heat transfer sheet 610 in a heat conductive manner by soldering or the adhesive tape. Alternatively, one end of the heat transfer sheet 610 may adhere to at least one of the inlet plate 401, the support plate 402, and the sidewall 403 of the blower 100 in a heat conductive manner. Consequently, the heat pipe 600 can efficiently conduct the heat to the housing 400 of the blower 100. Thus, the blower 100 can also radiate the heat generated in the CPU 520 to the efficiently-blown air, and emit the heat to the outside of the information device 500.

2. Others

The embodiment of the present invention has been described above. The scope of the present invention is not limited to the embodiment. Various modifications can be made without departing from the scope of the present invention. The items described in the embodiment can arbitrarily be combined as appropriate within a consistent range.

For example, the present invention is useful as a low-profile blower fan. However, the present invention is not limited to the blower fan.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A blower comprising:
   an impeller that is rotatable about a central axis; and
   a motor that drives the impeller,
   wherein the impeller includes
      a plurality of vanes arranged in a circumferential direction,
      a flange in which the plurality of vanes are provided at an outer circumferential edge on a radial-direction outside, and a first shielding unit having a plate shape and located between each pair of adjacent vanes in the circumferential direction, and the first shielding unit is connected to a a vane rear edge surface on an opposite side to the rotating direction and an outside surface located on the radial-direction outside of the flange, wherein the impeller further includes a plate-shaped second shielding unit, and the second shielding unit is provided between the outside surface located on the radial-direction outside of the flange and a front edge surface located on the rotation direction side in the circumferential direction of the vanes between the vanes adjacent to each other in the circumferential direction, wherein between the vanes adjacent to each other in the circumferential direction, a first area viewed from the axial direction of the first shielding unit is larger than a second area viewed from the axial direction of the second shielding unit.

2. The blower according to claim 1, wherein the rear edge surface of each of the vanes is curved toward the opposite side to the rotation direction in the circumferential direction when viewed from the axial direction.

3. The blower according to claim 2, wherein when viewed from the axial direction, a first end on a radial-direction outside of the first shielding unit is located on a radial-direction inside with respect to a second end located on the opposite side to the rotation direction in the circumferential direction of the first shielding unit between an inner end and an outer end in the radial direction of the vanes, and an edge on the opposite side to the rotation direction in the circumferential direction of the first shielding unit extends from the first end toward the outer circumferential edge of the flange.

4. The blower according to claim 3, wherein the first end of the first shielding unit is located on the rotation direction side in the circumferential direction with respect to the second end.

5. The blower according to claim 3, wherein when viewed from the axial direction, the first end of the first shielding unit is located in the rear edge surface on the opposite side to the rotation direction in the circumferential direction of the vanes, the edge includes a linear unit extending straight toward the outer circumferential edge of the flange, and a direction in which the straight unit extends is parallel to a direction in which a tangent of the rear edge surface at the first end extends.

6. The blower according to claim 5, wherein the edge further includes a first curved unit extending from a third end to a fourth end on the radial-direction inside of the linear unit, and the fourth end is an end of the edge on the opposite side to the rotation direction in the circumferential direction of the first shielding unit, and is located on an outside surface located on the radial-direction outside of the flange when viewed from the axial direction.

7. The blower according to claim 6, wherein when viewed from the axial direction, between the vanes adjacent to each other in the circumferential direction, a distance along the outside surface of the flange between one of the vanes on the rotation direction side in the circumferential direction and the fourth end is longer than a distance along the outside surface of the flange between the other vane located on the opposite side to the rotation direction in the circumferential direction and the fourth end.

8. The blower according to claim 1, wherein the second shielding unit includes a second curved unit extending from the outer circumferential edge of the flange toward a fifth end on the front edge surface, the fifth end is an outer end on the radial-direction outside of the second shielding unit, and the second curved unit is an edge in the rotation direction of the second shielding unit.

9. The blower according to claim 1, wherein the first area is at least triple the second area.

10. The blower according to claim 1, further comprising a housing that accommodates the impeller and the motor, wherein the housing includes a first housing unit that faces one end surface of each vane with a gap interposed therebetween, the one end surface of each vane being located on one side in the axial direction of the vane, and a second housing unit that faces the other end surface of the each vane with a gap interposed therebetween, the other end surface of the each vane being located on the other side in the axial direction of the each vane, and the first housing unit includes an inlet port penetrating in the axial direction.

11. The blower according to claim 10, wherein the one end surface of each vane includes a first vane end surface located on the radial-direction outside with respect to the inlet port, the first vane end surface is inclined onto one side in the axial direction with respect to a plane orthogonal to the central axis toward the radial-direction outside, and the first housing unit further includes a first plate provided in parallel to the first vane end surface on one side in the axial direction with respect to the first vane end surface of each of the plurality of vanes.

12. The blower according to claim 10, wherein the one end surface of each vane includes a second vane end surface located on the radial-direction outside with respect to the inlet port, the second vane end surface is inclined onto the other side in the axial direction with respect to a plane orthogonal to the central axis toward the radial-direction outside, and the first housing unit further includes a second plate provided in parallel to the second vane end surface on one side in the axial direction with respect to the second vane end surface of each of the plurality of vanes.

13. The blower according to claim 1, wherein the rear edge surface of each vane includes a rear surface parallel to the axial direction in sectional view from a direction in which the vane extends, and at least one of a first curved surface and a second curved surface, the first curved surface has a curved shape projecting toward the opposite direction to the rotation direction in the circumferential direction and one side in the axial direction, and is connected to an end on one side in the axial direction of the rear surface, and the second curved surface has a curved shape projecting toward the opposite direction to the rotation direction in the circumferential direction and the other side in the axial direction, and is connected to an end on the other side in the axial direction of the rear surface.

14. A blower comprising:

an impeller that is rotatable about a central axis; and a motor that drives the impeller, wherein the impeller includes
a plurality of vanes arranged in a circumferential direction,
a flange in which the plurality of vanes are provided at an outer circumferential edge on a radial-direction outside, and
a first shielding unit having a plate shape and located between each pair of adjacent vanes in the circumferential direction, and
the first shielding unit is connected to a vane rear edge surface on an opposite side to the rotating direction and an outside surface located on the radial-direction outside of the flange,
wherein the rear edge surface of each of the vanes is curved toward the opposite side to the rotation direction in the circumferential directions when viewed from the axial directions,
wherein
when viewed from the axial direction,
a first end on a radial-direction outside of the first shielding unit is located on a radial-direction inside with respect to a second end located on the opposite side to the rotation direction in the circumferential direction of the first shielding unit between an inner end and an outer end in the radial direction of the vanes, and
an edge on the opposite side to the rotation direction in the circumferential direction of the first shielding unit extends from the first end toward the outer circumferential edge of the flange,
wherein the first end of the first shielding unit is located on the rotation direction side in the circumferential direction with respect to the second end.

15. The blower according to claim 14, wherein
when viewed from the axial direction,
the first end of the first shielding unit is located in the rear edge surface opposite side to the rotation direction in the circumferential direction of the vanes,
the edge includes a linear unit extending straight toward the outer circumferential edge of the flange, and
a direction in which the straight unit extends is parallel to a direction in which a tangent of the rear edge surface at the first end extends.

16. The blower according to claim 15, wherein
the edge further includes a first curved unit extending from a third end to a fourth end on the radial-direction inside of the linear unit, and
the fourth end is an end of the edge on the opposite side to the rotation direction in the circumferential direction of the first shielding unit, and is located on an outside surface located on the radial-direction outside of the flange when viewed from the axial direction.

17. The blower according to claim 16, wherein when viewed from the axial direction, between the vanes adjacent to each other in the circumferential direction, a distance along the outside surface of the flange between one of the vanes on the rotation direction side in the circumferential direction and the fourth end is longer than a distance along the outside surface of the flange between the other vane located on the opposite side to the rotation direction in the circumferential direction and the fourth end.

18. The blower according to claim 14, further comprising a housing that accommodates the impeller and the motor,
wherein the housing includes a first housing unit that faces on end surface of each vane with gap interposed therebetween, the one end surface of each vane being located on one side in the axial direction of the vane, and second housing unit that faces the other end surface of the each vane with a gap interposed therebetween, the other end surface of the each vane being located on the other side in the axial direction of the each vane, and
the first housing unit includes an inlet port penetrating in the axial direction.

19. The blower according to claim 18, wherein the one end surface of each vane includes a first vane end surface located on the radial-direction outside with respect to the inlet port,
the first vane end surface is inclined onto one side in the axial direction with respect to a plane orthogonal to the central axis toward the radial-direction outside, and
the first housing unit further includes a first plate provided in parallel to the first vane end surface on one side in the axial direction with respect to the first vane end surface of each of the plurality of vanes.

20. The blower according to claim 18, wherein the one end surface of each vane includes a second vane end surface located on the radial-direction outside with respect to the inlet port,
the second vane end surface is inclined onto the other side in the axial direction with respect to a plane orthogonal to the central axis toward the radial-direction outside, and
the first housing unit further includes a second plate provided in parallel to the second vane end surface on one side in the axial direction with respect to the second vane end surface of each of the plurality of vanes.

21. The blower according to claim 14, wherein the rear edge surface of each vane includes a rear surface parallel to the axial direction in sectional view from a direction in which the vane extends, and at least one of a first curved surface and a second curved surface,
the first curved surface has a curved shape projecting toward the opposite direction to the rotation direction in the circumferential direction and one side in the axial direction, and is connected to an end on one side in the axial direction of the rear surface, and
the second curved surface has a curved shape projecting toward the opposite direction to the rotation direction in the circumferential direction and the other side in the axial direction, and is connected to an end on the other side in the axial direction of the rear surface.

* * * * *